United States Patent [19]

Ury et al.

[11] Patent Number: 4,868,509
[45] Date of Patent: Sep. 19, 1989

[54] METHOD AND APPARATUS FOR DETECTING MAGNETRON POWER SUPPLY FAILURE

[75] Inventors: Michael G. Ury, Bethesda; William J. Jones, Baltimore, both of Md.

[73] Assignee: Fusion Systems Corporation, Rockville, Md.

[21] Appl. No.: 197,255

[22] Filed: May 23, 1988

[51] Int. Cl.$^4$ ...................... G01R 31/06; G01R 31/02
[52] U.S. Cl. ...................................... 324/547; 324/55; 324/511; 219/10.55 B
[58] Field of Search ................................ 324/509–511, 324/522, 524, 537, 546, 547, 555, 55; 340/646, 664; 361/36, 87; 363/59–61; 219/10.55 B; 315/277

[56] References Cited

U.S. PATENT DOCUMENTS

| | | | |
|---|---|---|---|
| 3,973,185 | 8/1976 | Beak et al. | 361/87 X |
| 4,175,246 | 11/1979 | Feinberg et al. | 315/277 X |
| 4,734,924 | 3/1988 | Yahata et al. | 361/87 X |

Primary Examiner—Reinhard J. Eisenzopf
Assistant Examiner—Jack B. Harvey
Attorney, Agent, or Firm—Pollock, Vande Sande & Priddy

[57] ABSTRACT

A method and apparatus for detecting system failure in a magnetron power supply circuit. The apparatus is capable of providing an indication as to whether it is the power supply or the magnetron which has failed. A dual half wave doubler power supply circuit is provided and the currents corresponding to the respective dual portions are measured. The currents are compared to detect a failure of one of the dual power supply circuits while a sum of the currents may detect a failure of the magnetron.

13 Claims, 2 Drawing Sheets

METHOD AND APPARATUS FOR DETECTING MAGNETRON POWER SUPPLY FAILURE

The present invention relates to magnetron power supply systems, and particularly, is a method and apparatus for monitoring the system, and upon system failure, for determining whether the magnetron or power supply has failed.

Magnetrons for generating microwave energy are well known, and for example, find use in microwave ovens and electrodeless lamps.

Inevitably, from time to time, problems with such systems develop, and the lamps extinguish or fail to light, or the microwave ovens fail to heat. Before the making of the present invention, in the case of electrodeless lamps, upon such failure, it had been the practice of the inventors herein to determine by trial and error which component of the system had malfunctioned, by first replacing the lamp bulb, then the magnetron, and finally, the power supply.

It clearly is more desirable to provide a system for automatically and unambiguously indicating which of the components has failed, and it is to that end that the present invention is directed.

The present invention is based on the discovery that if a power supply having dual power supply transformer circuitry is used for supplying a single magnetron, the magnitudes of the transformer currents will provide an unambiguous indication of which component has failed. More particularly, it has been discovered that if the transformer currents are very different from each other, one of the dual power supply circuits has failed, while if the transformer currents are close to each other, but the sum of the transformer currents is out of specification, it is the magnetron which has failed.

Thus, in accordance with the invention, a method and apparatus for resolving system failure is provided, which comprises, providing a magnetron which is powered by a dual half wave doubler circuit having dual first and second power supply portions including first and second transformers respectively, sensing the magnitude of the current flowing in the primaries of the first and second transformers, and comparing the magnitudes of such currents, to determine whether the power supply has failed.

Further, the primary currents are summed, and the sum compared to a predetermined criterion to determine whether the magnetron has failed.

It is thus an object of the present invention in magnetron power supply circuitry to provide an unambiguous indication of whether the magnetron or power supply has failed.

It is a further object of the invention to provide such unambiguous indication of failure utilizing relatively low cost components.

The invention will be better understood by referring to the detailed description which follows when taken in connection with the drawings herein, in which.

Figure 1:
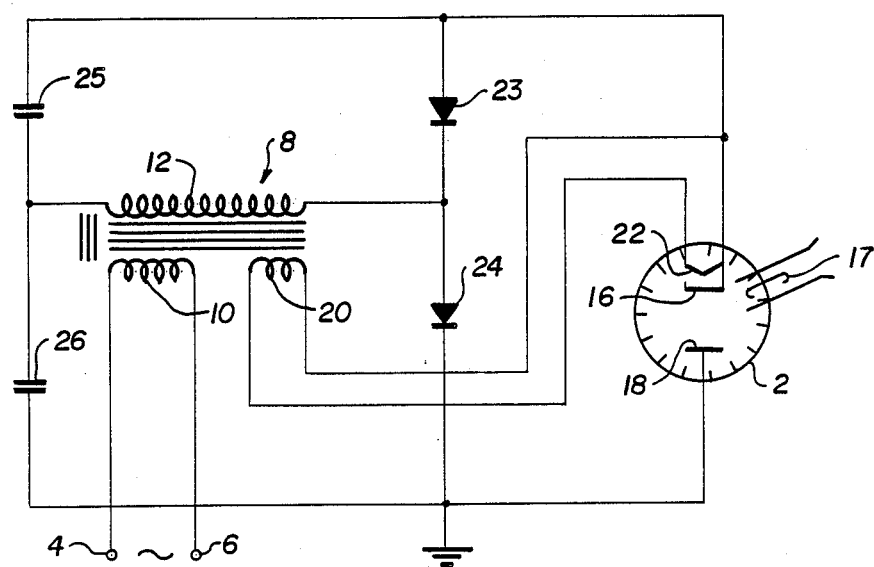
FIG. 1 is a schematic diagram of a full wave voltage doubler circuit for providing power to a magnetron.

FIG. 1 is a schematic of a full wave voltage doubler which provides power to magnetron 2. The input at terminals 4 and 6 is A.C., and the output to the magnetron is full wave pulsed D.C. This circuit is described in Feinberg et al. U.S. Pat. No. 4,175,246, which is incorporated herein by reference.

In the circuit of FIG. 1, transformer 8 is a high leakage reactance transformer having a primary 10 and a secondary 12. The magnetron 2 is designed to be energized by pulsed D.C. to produce microwave energy.

The cathode 16 of the magnetron is at high voltage relative to the anode 18, which is at ground potential. A winding 20 of the transformer provides the power for energizing the filament 22 of the magnetron.

Figure 2:
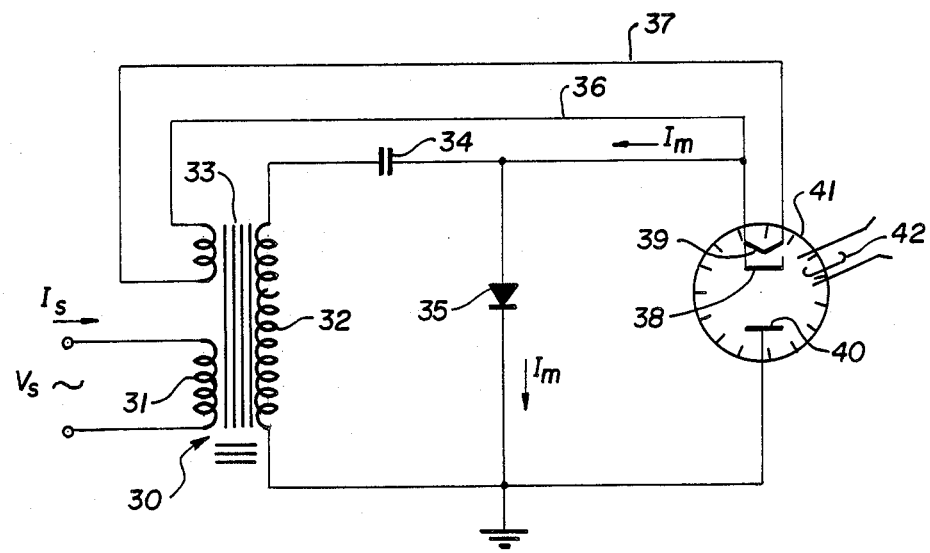
FIG. 2 is a schematic diagram of a half wave voltage doubler circuit for providing power to a magnetron.

The circuit shown in FIG. 2 is a half wave voltage doubler. It is also described in U.S. Pat. No. 4,175,246, and is equivalent in operation to the full wave doubler of FIG. 1, except that it provides half wave instead of full wave rectification of the input voltage.

The circuit depicted in FIG. 1 is the magnetron energizing circuit previously used by the inventors herein. However, with this circuit, it was not possible to provide an unambiguous indication of whether system failure was caused by the magnetron or power supply.

Thus, the source or line current $I_s$ and the magnetron current $I_m$ for various failure conditions of magnetron and power supply are set forth below. For the sake of simplicity, these are given in connection with the half wave doubler shown in FIG. 2, although the full wave doubler results in similar ambiguities.

| Magnetron Fails As Follows: | | |
|---|---|---|
| Filament Opens | $I_m \to 0$ | $I_s$ reduced to 15% |
| Tube Gassy (Mag-Shorts) | $I_m \to I_{normal} + 10/20\%$ | |
| | $I_s \to$ reduced to 50% | |
| Power Supply Fails as Follows: | | |
| Diode Open | $I_m \to 0$ | $I_s < 50\%$ |
| Diode Short | $I_m \to 0$ | $I_s < 50\%$ |
| Cap. Open | $I_m \to 0$ | $I_s \sim 15\%$ |
| Cap. Short | $I_m \to 2 \times I_{normal}$ | $I_s \to 4 - 5 \times I_s$ normal |
| Trans. Secondary Open | $I_m \to 0$ | $I_s \to \sim 20\%$ |
| Trans. Secondary Short | $I_m \to 0$ | $I_s \to$ goes $> I_s$ normal |
| Trans. Primary Open | $I_m \to 0$ | $I_s \to 0$ |
| Trans. Primary Short | $I_m \to 0$ | $I_s \to \infty$ |

Thus, it can be seen that if the line current $I_s$ and the magnetron current $I_m$ are monitored, it cannot be determined whether the magnetron or power supply has failed. For example, an open capacitor looks the same as an open filament on the magnetron, while an open magnetron looks like an open transformer secondary.

The inventors have recognized that if a circuit having dual transformer portions is used for supplying power to a single magnetron, the magnitudes of the transformer primary currents themselves, without resort to the magnetron current, if processed in accordance with certain mathematicl algorithms will provide an unambiguous indication of whether the magnetron or power supply has failed.

Figure 3:
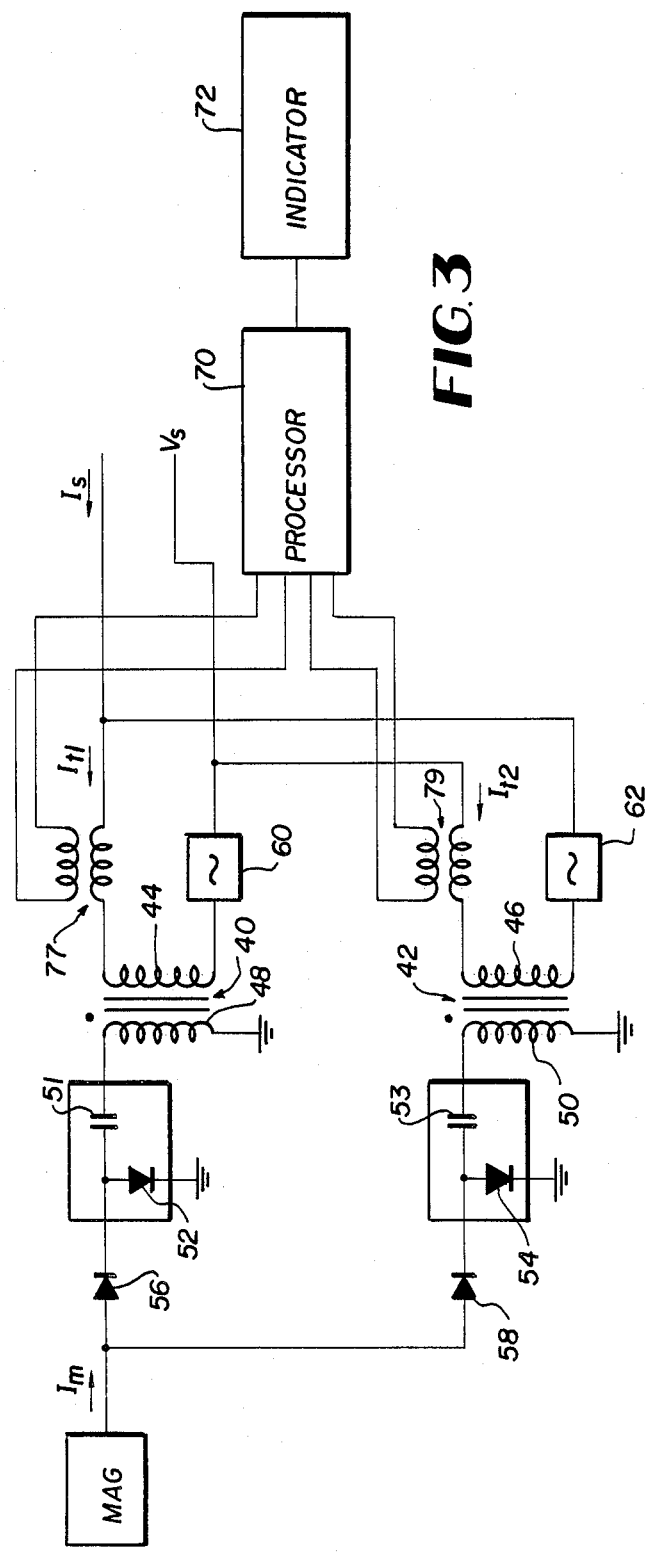
FIG. 3 is a diagram of an embodiment of the present invention, utilizing a dual half wave voltage doubler circuit.

Thus, FIG. 3 depicts circuitry used in an embodiment of the invention, and the power supply circuit shown is known by Applicants as a dual half wave voltage doubler. This circuit is also described in the above-mentioned Feinberg Pat. No. 4,175,246, which is incorporated herein by reference.

Figure 5:
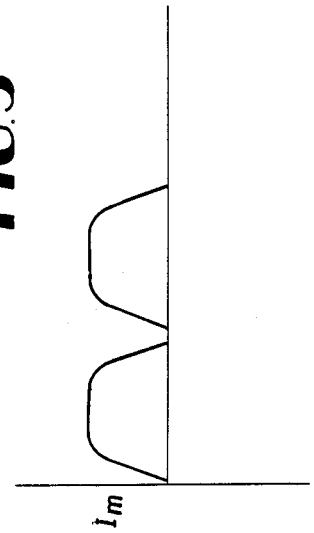
FIG. 5 is a representation of the resultant magnetron current $I_m$.
Figure 4:
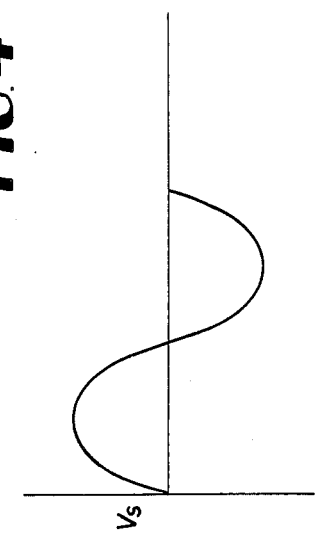
FIG. 4 is a representation of the supply voltage waveform $V_s$.

The dual half wave doubler circuit effectively provides full wave rectification, and reference may be had to FIG. 4 which illustrates the input voltage $V_s$, while FIG. 5 depicts the resultant pulsed D.C. magnetron current $I_m$.

Referring to FIG. 3, transformers 40 and 42 have respective primary windings 44 and 46 which are connected in parallel. The respective secondary windings 48 and 50 are connected effectively in series, with their common connection being ground. The return path rectifiers 52 and 54 are connected opposite to each other while rectifiers 56 and 58 have their anodes connected in common to the cathode of the magnetron. The transformer also includes a winding for energizing the filament of the magnetron, which is not shown in the figure.

With the use of the circuit shown in FIG. 3, an unambiguous indication of whether the magnetron or power supply may be provided by processing the transformer primary currents in accordance with certain algorithms.

Thus, the transformer primary currents are represented by $I_{t1}$ and $I_{t2}$ and where:

$I_{t1} + I_{t2} = I_s$, it has been found that,

If $I_{t1} > I_{t2}$ by 50% or $I_{t2} > I_{t1}$ by 50%, then the power supply has failed.

On the other hand,

If $I_{t1} \approx I_{t2}$ (within 25%), then the power supply has not failed.

If $I_{t1} + I_{t2}$ is out of specification (greater or smaller) by more than 25% but $I_{t1} \approx I_{t2}$ (within 25%), then the magnetron has failed and the power supply has not.

It is noted that the principle of the invention is based on the assumption that the dual circuit portions of the power supply will not simultaneously fail, which for practical purposes is valid since the probability of simultaneous failure is extremely low.

Referring to FIG. 3, the transformer primary currents, $I_{t1}$ and $I_{t2}$ are fed to processor 70 via current viewing transformers 77 and 79, for performing the necessary mathematical operations. These are performed in a straightforward manner was well known to those skilled in the art, for example by appropriate programming of an 8031 microprocessor (Intel).

The output of processor 70 is fed to indicator 72 for displaying an indication of whether the failed component is the magnetron or the power supply, and if the power supply, which of the dual portions thereof. In the preferred embodiment of the invention, the indicator comprises a LED or LCD display.

There thus has been provided a relatively simple and cost-effective procedure for unambiguously determining magnetron power supply system failure.

While the invention has been discussed in connection with a magnetron power supply system for providing energy for an electrodeless lamp or a microwave oven as examples, it is noted that the invention relates to magnetron power supply circuits generally regardless of end application.

Additionally, while the invention has been described in accordance with an illustrative embodiment, it should be understood that variations will occur to those skilled in the art, and the scope of the invention is to be limited only by the claims appended hereto and equivalents.

We claim:

1. In power supply circuitry for powering a magnetron, a method of determining whether the power supply or the magnetron has failed, comprising the steps of, providing a magnetron which is powered by a dual half wave doubler circuit having dual first and second circuit portions including first and second transformers respectively, sensing the magnitude of a first current flowing in the primary of the first transformer, sensing the magnitude of a second current flowing in the primary of the second transformer, and comparing the magnitudes of the first and second currents to determine if the first current is more than a certain amount greater than the second current or if the second current is more than a certain amount greater than the first current, whereby it is determined whether the power supply has failed.

2. The method of claim 1 further comprising the steps of, summing the first and second currents, determining whether such sum is out of specification by more than a first criterion, and determining whether the magnitudes of said first and second currents are closer to each other than a second criterion, whereby it is determined whether the magnetron has failed.

3. The method of claim 1 further comprising the steps of, indicating that the first power supply portion of the doubler has failed if the second current is more than said certain amount greater than the first current, and indicating that the second power supply portion of the doubler has failed if the first current is more than said certain amount greater than the second current.

4. The method of claim 2 further comprising the steps of, indicating that the first power supply portion of the doubler has failed if the second current is more than said certain amount greater than the first current, and indicating that the second power supply portion of the doubler has failed if the first current is more than said certain amount greater than the second current.

5. The method of claim 2 further including the step of, determining whether the first or second currents have become much larger than normal.

6. The method of claim 4 wherein the power supply circuitry is used for powering an electrodeless lamp.

7. The method of claim 1 wherein said certain amount greater comprises about 50% greater.

8. The method of claim 2 wherein said first criterion comprises about 25% and wherein said second criterion comprises about a 25% difference.

9. The method of claim 2 wherein said certain amount greater comprises about 50% greater, said first criterion comprises about 25%, and said second criterion comprises about a 25% difference.

10. The method of claim 9 wherein the power supply circuitry is used for powering an electrodeless lamp.

11. In power supply circuitry for powering a magnetron, an apparatus for determining whether the power supply or the magnetron has failed, comprising,
 a magnetron,
 a dual half wave doubler circuit for powering the magnetron, the dual half wave doubler circuit having dual first and second circuit portions including first and second transformers respectively,
 means for sensing the magnitude of a first current flowing in the primary of the first transformer,
 means for sensing the magnitude of a second current flowing in the primary of the second transformer, and
 means for comparing the magnitude of the first and second currents to determine if the first current is more than a certain amount greater than the second current or if the second current is more than a certain amount greater than the first current, whereby it is determined whether the power supply has failed.

12. The apparatus of claim 11 further comprising,
 means for summing the first and second currents,
 means for determining whether such sum is out of specification by more than a first criterion, and
 means for determining whether the magnitudes of the first and second currents are closer to each other than a second criterion, whereby it is determined whether the magnetron has failed.

13. The apparatus of claim 12 further comprising first and second fuse means for respectively determining whether the first or second currents have become much larger than normal.

* * * * *